United States Patent
Pokhama

(10) Patent No.: US 6,937,472 B2
(45) Date of Patent: Aug. 30, 2005

(54) APPARATUS FOR COOLING HEAT GENERATING COMPONENTS WITHIN A COMPUTER SYSTEM ENCLOSURE

(75) Inventor: Himanshu Pokhama, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/435,151

(22) Filed: May 9, 2003

(65) Prior Publication Data

US 2004/0223302 A1 Nov. 11, 2004

(51) Int. Cl.[7] .................................................. H05K 7/20
(52) U.S. Cl. .................... 361/700; 361/690; 361/695; 174/15.2; 257/715; 165/80.4; 165/104.26
(58) Field of Search ........................ 361/673, 689, 361/690–700; 257/714–715, 721–722; 165/80.3, 80.4, 122; 174/15.2; 417/436; 415/125

(56) References Cited

U.S. PATENT DOCUMENTS

| | | | | |
|---|---|---|---|---|
| 4,063,826 A | * | 12/1977 | Riepe | 417/410.1 |
| 4,498,851 A | * | 2/1985 | Kolm et al. | 417/410.2 |
| 4,780,062 A | * | 10/1988 | Yamada et al. | 417/410.2 |
| 4,834,619 A | * | 5/1989 | Walton | 417/53 |
| 4,923,000 A | * | 5/1990 | Nelson | 165/122 |
| 5,008,582 A | * | 4/1991 | Tanuma et al. | 310/332 |
| 5,104,626 A | * | 4/1992 | Yang | 422/124 |
| 5,566,377 A | | 10/1996 | Lee | |
| 5,914,856 A | * | 6/1999 | Morton et al. | 361/690 |
| 5,966,286 A | | 10/1999 | O'Conner et al. | |
| 6,043,978 A | * | 3/2000 | Mody et al. | 361/690 |
| 6,123,145 A | | 9/2000 | Glezer et al. | |
| 6,252,769 B1 | * | 6/2001 | Tullstedt et al. | 361/694 |
| 6,347,034 B1 | | 2/2002 | Holmberg | |
| 6,357,515 B1 | * | 3/2002 | Bhatia | 165/80.3 |
| 6,501,654 B2 | | 12/2002 | O'Connor et al. | |
| 6,567,269 B2 | * | 5/2003 | Homer et al. | 361/700 |
| 6,588,497 B1 | | 7/2003 | Glezer et al. | |
| 6,611,425 B2 | | 8/2003 | Ohashi et al. | |
| 6,629,425 B2 | | 10/2003 | Vaiyapuri | |
| 6,631,077 B2 | | 10/2003 | Zuo | |
| 6,650,542 B1 | | 11/2003 | Chrysler et al. | |

* cited by examiner

*Primary Examiner*—Boris Chervinsky
(74) *Attorney, Agent, or Firm*—Blakely, Sokoloff, Taylor & Zafman LLP

(57) ABSTRACT

An apparatus including a heat pipe having an evaporator portion and a condenser portion, the evaporator portion to be thermally coupled to a heat generating component; and an actuation membrane unit to generate air movement in a direction of the condenser portion of the heat pipe.

12 Claims, 3 Drawing Sheets

APPARATUS FOR COOLING HEAT GENERATING COMPONENTS WITHIN A COMPUTER SYSTEM ENCLOSURE

TECHNICAL FIELD

Embodiments described herein relate to heat management and more particularly to heat management using an actuation membrane.

BACKGROUND

A number of present day electronic components utilized, for example, in computer systems, generate large amounts of heat. These components, such as microprocessors and associated components are typically encapsulated in plastic or ceramic from which a plurality of leads extend. The integrated circuit (IC) is mounted to a printed circuit board either by direct soldering or through a connector which is soldered to the printed circuit board. In a typical personal computer system, a processor, which in most cases in current systems is a high speed processor which generates a great deal of heat, is mounted on a printed circuit board known as a motherboard, along with a plurality of other components that support the processor such as memory circuits. Also contained within the personal computer housing are additional circuits or circuit boards such as video cards, facsimile-modem cards, etc. The housing may also contain a power supply, supplying power to all of the various components.

It is desirable to have a high rate of heat transfer from the IC package in order to maintain junction temperatures within the IC inside safe operating limits. As noted, modern microprocessors typically employ millions of transistors in internal circuitry that requires some type of cooling mechanism to avoid excessive junction temperatures that may affect the performance of the circuit and can cause permanent degradation of the device. This is a particularly difficult problem in the design of computer system enclosures which have a small form factor such as laptop and notebook computers. However, heat removal also can constitute a problem in other types of systems which have high power profile components located within a small form factor or thin profile electronic device.

Aside from the possibility of affecting the performance of the circuits in the IC and degradation of those circuits, high heat generating components which are located within consumer electronic devices, such as laptop computers, can create hot spots at certain locations along the external casing of the devices. These hot spots can be uncomfortable to touch and may even cause burns. This is a further reason for conducting heat away from these hot spots and cooling the components generating them to avoid injury to users.

Prior art methods used to remove heat from heat generating components located within the confines of a computer enclosure include the simple attachment of finned-heat sinks; the development of finned-heat sinks with intricate fins; the use of large flat heat spreading plates to which an IC is directly or indirectly attached; and the thermal coupling of the integrated circuit to a heat spreading plate by a heat pipe or other low resistance thermal path. However, these prior art methods do not provide sufficient heat removal capacity and/or efficiency needed to cool current and future high performance microprocessors and other high heat generating devices in portable general purpose or other thin profile electronic devices.

DETAILED DESCRIPTION

Embodiments of a remote heat exchanger that includes an actuation membrane to generate air movement to reduce a temperature of a heat generating device, are disclosed. In the following description, numerous specific details are set forth. However, it is understood that embodiments may be practiced without these specific details. In other instances, well-known circuits, structures and techniques have not been shown in detail in order not to obscure the understanding of this description.

Reference throughout this specification to "one embodiment" or "an embodiment" indicate that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Figure 1:
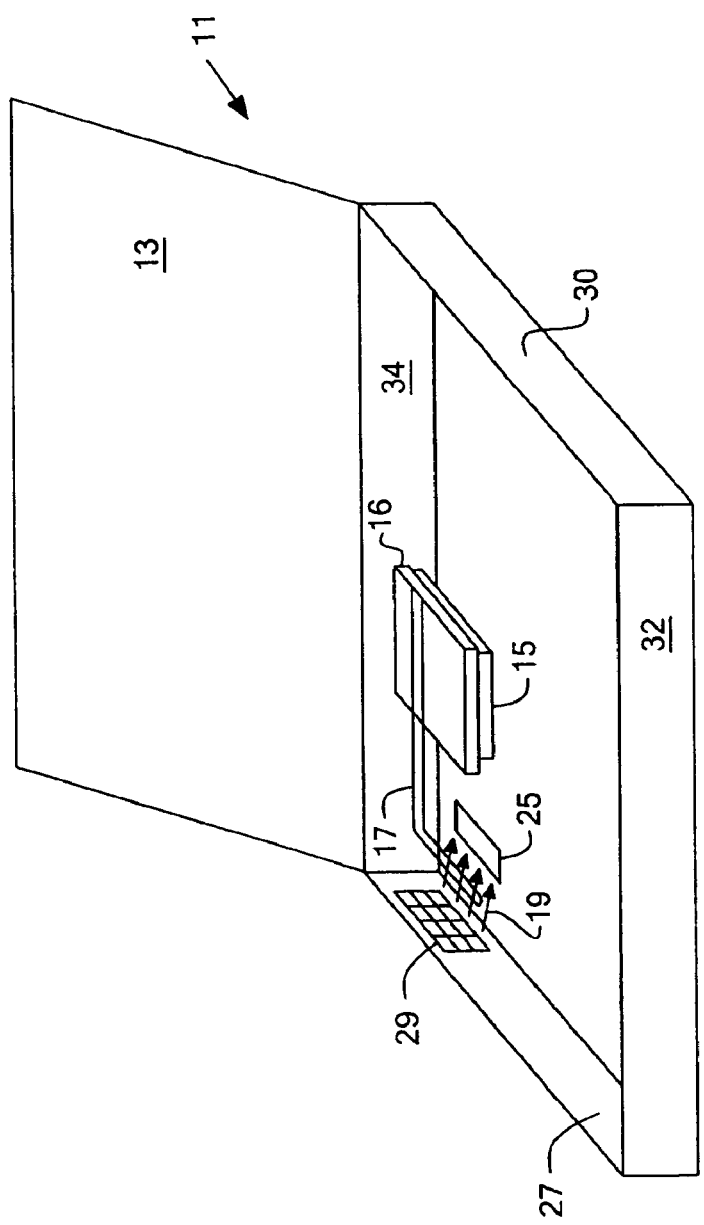
FIG. 1 is a perspective view of the heat exchanger according to one embodiment.

FIG. 1 is a perspective view of the heat exchanger according to one embodiment. Illustrated is a notebook or laptop computer 11 including an enclosure with vertical side walls 27 and 30, a vertical front wall 32 and a vertical rear wall 34. As is conventional, the laptop includes a display 13. The laptop is shown with the top of its enclosure, which would contain the keyboard, removed. Within the enclosure of the notebook computer 11 is a central processing unit 15 which is a high heat generating component from which heat must be removed to both maintain the performance of the processor and also to avoid hot spots on the housing of the computer 11. The processor is connected to a heat sink 16 which in turn is thermally connected to a heat pipe 17. In alternative embodiments, the heat sink and heat pipe could be coupled to other heat generating devices, such as a memory unit, a chipset, a graphics processor, and/or a wireless mini card, in order to assist in removing the heat generated by such devices.

The heat pipe 17 is thermally coupled to a heat exchanger, which in one embodiment includes a set of fins 19, which increase the surface area in contact with flowing air. Air is drawn through the fins of the heat exchanger by an actuation membrane unit 25 (sometimes referred to herein as a synthetic jet). In one embodiment, an air outlet opening 29 is formed in the side wall 27 of the housing 11 of the computer to allow air that passes across the fins to exit the housing of the computer.

Figure 2:
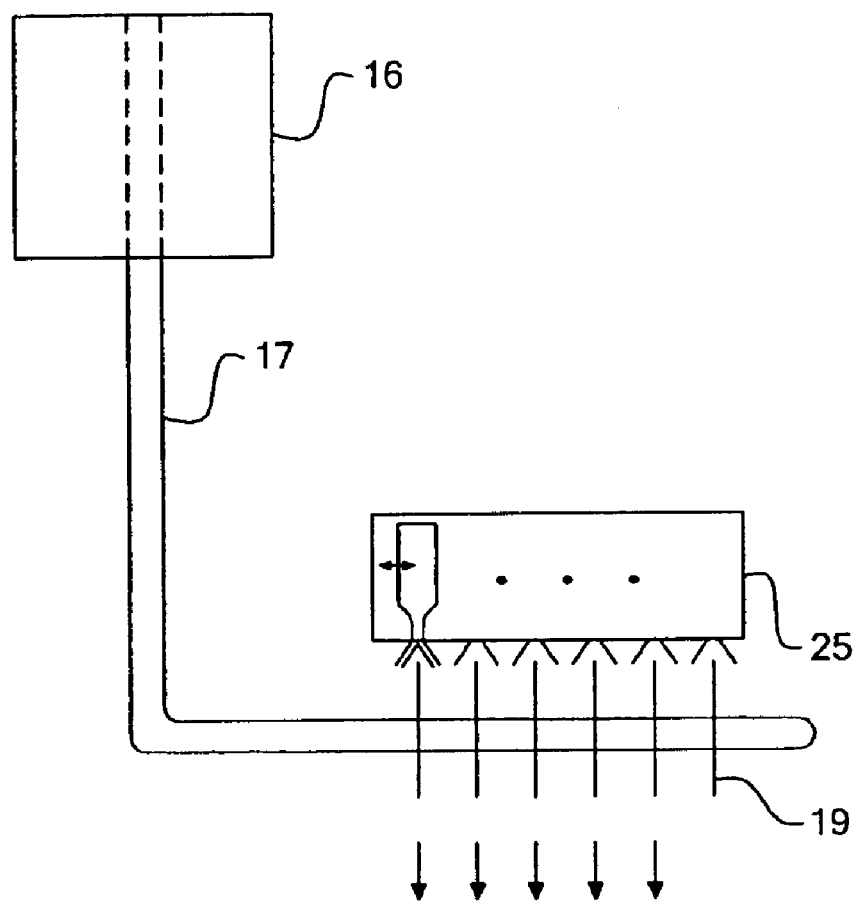
FIG. 2 is an illustration of the connection between the heat sink of the heat generating component and the heat exchanger via the heat pipe, according to one embodiment.

FIG. 2 shows further details concerning an arrangement according to the one embodiment. The heat sink 16 for the CPU 15 of FIG. 1 is in thermal contact with the heat pipe 17 which is bent at a 90° angle. The heat pipe 17 is in contact with the heat exchanger 19 along one surface thereof. As illustrated, the actuation membrane unit 25 generates a jet stream of air across the set of fins 19, which exits through a vent of the computer on the opposite side of the fins. Alternative arrangements of the heat pipe and heat exchanger can be provided without departing from the scope of the invention.

The heat pipe 17, which as is shown in FIG. 2 is in thermal contact with the set of fins, includes a wick and contains a working fluid which is evaporated by the heat generated at the heat sink 16 associated with the heat generating component, i.e., the CPU 15. The vapor is condensed along the surface of the heat pipe in contact with the set of fins permitting the condensed fluid to then be wicked back to the heated end of the heat pipe where it is again condensed, forming a close system.

Figure 3:
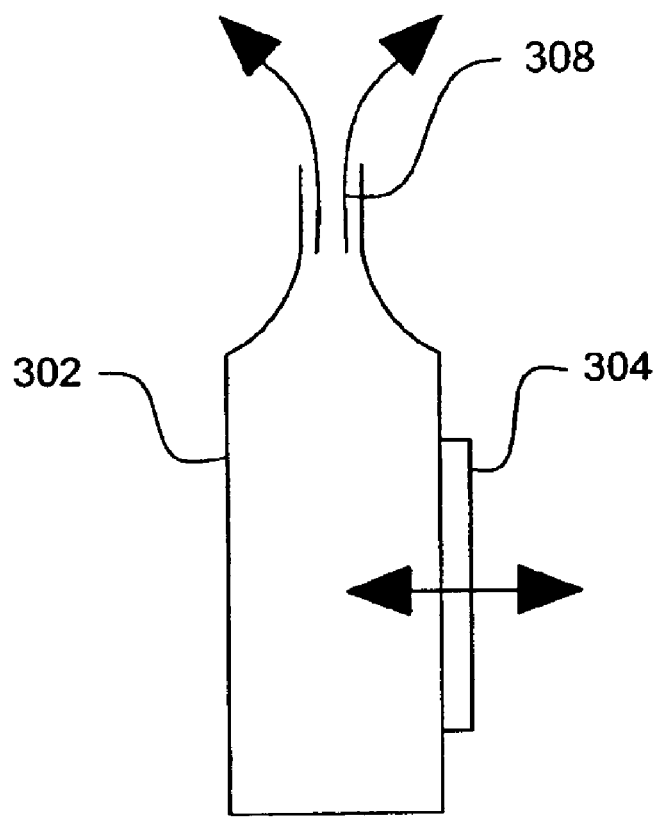
FIG. 3 is an illustration of an actuation membrane unit according to one embodiment.

In one embodiment illustrated in FIG. 3, the actuation membrane unit 302, which is used to generate a jet stream of air across the fins of the heat exchanger, includes a piezoelectric or electromagnetic membrane 304. The membrane 304 oscillates inward and outward, to pull air into the unit and force air out of the unit, respectively, to generate jet stream of air. More specifically, as shown in FIG. 3, when the membrane 304 oscillates outward away from the unit 302, air is pulled into the unit through the relatively small opening 308. When the membrane 304 oscillates inward, the air is forced out a relatively small opening 308 of the unit 302 to produce a jet stream of air. In one embodiment, the actuation membrane unit 302 oscillation in the range of 20–200 Hz. In alternative embodiments, higher and lower ranges of oscillation are provided. In one embodiment, multiple sets of the individual actuation membranes would comprise the actuation membrane unit 302.

These embodiments have been described with reference to specific exemplary embodiments thereof. It will, however, be evident to persons having the benefit of this disclosure that various modifications and changes may be made to these embodiments without departing from the broader spirit and scope of the embodiments described herein. The specification and drawings are, accordingly, to be regarded in an illustrative rather than a restrictive sense.

What is claimed is:

1. Apparatus comprising:
 a heat pipe having an evaporator portion and a condenser portion, the evaporator portion to be thermally coupled to a heat generating component; and
 an actuation membrane unit to generate air movement in a direction of the condenser portion of the heat pipe, the actuation membrane unit including a piezoelectric actuation membrane.

2. The apparatus of claim 1, wherein the actuation membrane unit includes a piezoelectric actuation membrane.

3. The apparatus of claim 1, wherein the condenser portion of the heat pipe includes an outer surface with at least one fin protruding from the outer surface, and the actuation membrane unit is to generate air movement across the at least one fin.

4. The apparatus of claim 1, wherein the heat generating device is at least one of a group comprising of a memory unit, a chipset, a graphics processor, and a processor.

5. A computer system comprising:
 a heat generating unit;
 a heat pipe having an evaporator portion and a condenser portion, the evaporator portion to be thermally coupled to a heat generating unit; and
 an actuation membrane unit to generate air movement in a direction of the condenser portion of the heat pipe, the actuation membrane unit including a piezoelectric actuation membrane.

6. The system of claim 5, wherein the actuation membrane unit includes an electromagnetic actuation membrane.

7. The system of claim 5, wherein the condenser portion of the heat pipe includes an outer surface with at least one fin protruding from the outer surface, and the actuation membrane unit is to generate air movement across the at least one fin.

8. The system of claim 5, wherein the heat generating device is at least one of a group comprising of a memory unit, a chipset, a graphics processor, and a processor.

9. A computer system comprising:
 a heat generating unit;
 a graphics controller;
 a heat pipe having an evaporator portion and a condenser portion, the evaporator portion to be thermally coupled to a heat generating unit; and
 an actuation membrane unit to generate air movement in a direction of the condenser portion of the heat pipe, the actuation membrane unit including a piezoelectric actuation membrane.

10. The system of claim 9, wherein the actuation membrane unit includes an electromagnetic actuation membrane.

11. The system of claim 9, wherein the condenser portion of the heat pipe includes an outer surface with at least one fin protruding from the outer surface, and the actuation membrane unit is to generate air movement across the at least one fin.

12. The system of claim 9, wherein the heat generating device is at least one of a group comprising of a memory unit, a chipset, a graphics processor, and a processor.

* * * * *

UNITED STATES PATENT AND TRADEMARK OFFICE
CERTIFICATE OF CORRECTION

PATENT NO. : 6,937,472 B2  Page 1 of 1
APPLICATION NO. : 10/435151
DATED : August 30, 2005
INVENTOR(S) : Pokhama It is certified that error appears in the above-identified patent and that said Letters Patent is hereby corrected as shown below:

In column 3, at line 44, delete "piezoelectric" and insert --electromagnetic--.

Signed and Sealed this

Thirteenth Day of January, 2009

JON W. DUDAS
*Director of the United States Patent and Trademark Office*